United States Patent
Ballandras et al.

(10) Patent No.: US 9,666,786 B2
(45) Date of Patent: May 30, 2017

(54) VOLUME WAVE RESONATORS ON MICROMACHINED VERTICAL STRUCTURES

(71) Applicants: CENTRE NATIONAL DE LA RECHERCHE SCIENTIFIQUE (C.N.R.S.), Paris (FR); UNIVERSITE DE FRANCHE-COMTE, Besancon (FR); ECOLE NATIONALE SUPERIEURE DE MECANIQUE ET DES MICROTECHNIQUES, Besancon (FR)

(72) Inventors: Sylvain Ballandras, Besancon (FR); Gwenn Ulliac, Besancon (FR); Blandine Edouard-Guichardaz, Auxon-Dessous (FR); Thomas Baron, Besancon (FR); Jean-Yves Rauch, Auxon-Dessous (FR)

(73) Assignees: CENTRE NATIONAL DE LA RECHERCHE SCIENTIFIQUE, Paris (FR); UNIVERSITE DE FRANCHE-COMTE, Besancon (FR); ECOLE NATIONALE SUPERIEURE DE MECANIQUE ET DES MICROTECHNIQUES, Besancon (FR)

( * ) Notice: Subject to any disclaimer, the term of this patent is extended or adjusted under 35 U.S.C. 154(b) by 402 days.

(21) Appl. No.: 14/349,347

(22) PCT Filed: Oct. 5, 2012

(86) PCT No.: PCT/EP2012/069726
§ 371 (c)(1),
(2) Date: Apr. 3, 2014

(87) PCT Pub. No.: WO2013/050533
PCT Pub. Date: Apr. 11, 2013

(65) Prior Publication Data
US 2014/0246956 A1    Sep. 4, 2014

(30) Foreign Application Priority Data

Oct. 5, 2011 (FR) .................................... 11 58964

(51) Int. Cl.
*H01L 41/08* (2006.01)
*H03H 9/02* (2006.01)
(Continued)

(52) U.S. Cl.
CPC .......... *H01L 41/08* (2013.01); *H01L 41/0477* (2013.01); *H01L 41/18* (2013.01);
(Continued)

(58) Field of Classification Search
CPC .... H03H 9/02157; H03H 9/177; H03H 9/178; H03H 9/13; H01L 41/0986
(Continued)

(56) References Cited

U.S. PATENT DOCUMENTS

2003/0098632 A1* 5/2003 Takeuchi ........... G02B 6/12004
310/328
2006/0066175 A1   3/2006 Yamada

FOREIGN PATENT DOCUMENTS

JP     2001/044794 A    2/2001

OTHER PUBLICATIONS

International Search Report, dated Jan. 2, 2013, from corresponding PCT application.

* cited by examiner

*Primary Examiner* — Derek Rosenau
(74) *Attorney, Agent, or Firm* — Young & Thompson

(57) ABSTRACT

A bulk wave piezoelectric resonator operating at a predetermined frequency includes a substrate block, having a plane face, a first thickness and consisting of a first material, a resonant plate having a length, width and second thickness, (Continued)

and consisting of a second piezoelectric material, first and second metal electrodes at least partly covering the resonant plate on each side and partly facing each other. The resonant plate is fixed perpendicularly in the vicinity of the plane face of the substrate block so that the width of the resonant plate and the first thickness of the substrate block have the same direction, and the first material, the second material, the first thickness of the block of substrate, the length, the width, the second thickness of the resonant plate are configured for trapping bulk waves at the operating frequency of the resonator and for producing a plane-plane type bulk wave piezoelectric resonator.

8 Claims, 12 Drawing Sheets

(51) Int. Cl.
    *H03H 3/04*     (2006.01)
    *H03H 9/13*     (2006.01)
    *H03H 9/17*     (2006.01)
    *H01L 41/047*     (2006.01)
    *H01L 41/18*     (2006.01)

(52) U.S. Cl.
    CPC .......... *H03H 3/04* (2013.01); *H03H 9/02157* (2013.01); *H03H 9/13* (2013.01); *H03H 9/17* (2013.01); *H03H 2003/045* (2013.01); *Y10T 29/42* (2015.01)

(58) Field of Classification Search
    USPC ................................ 310/328, 359, 360, 320
    See application file for complete search history.

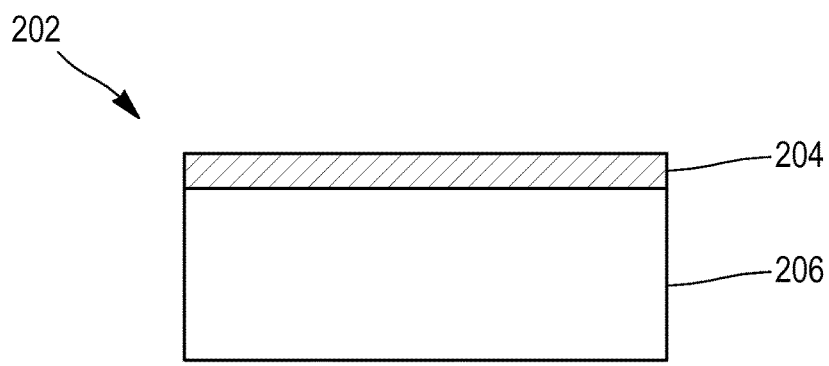
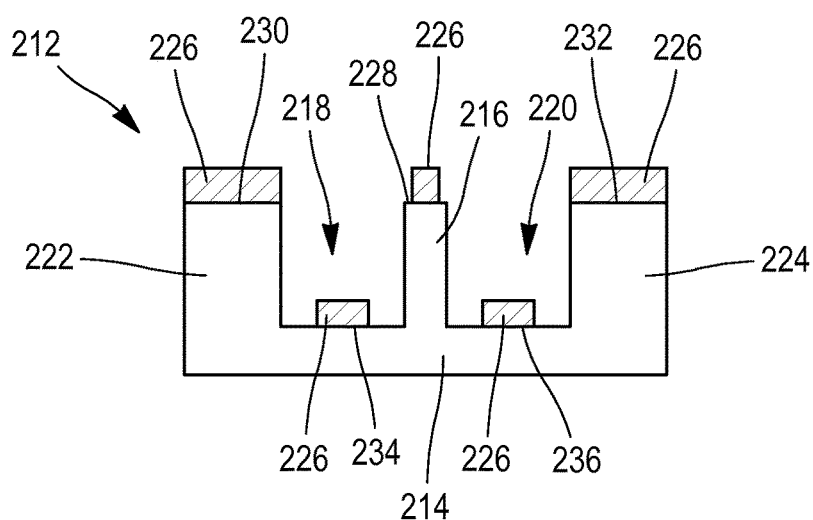
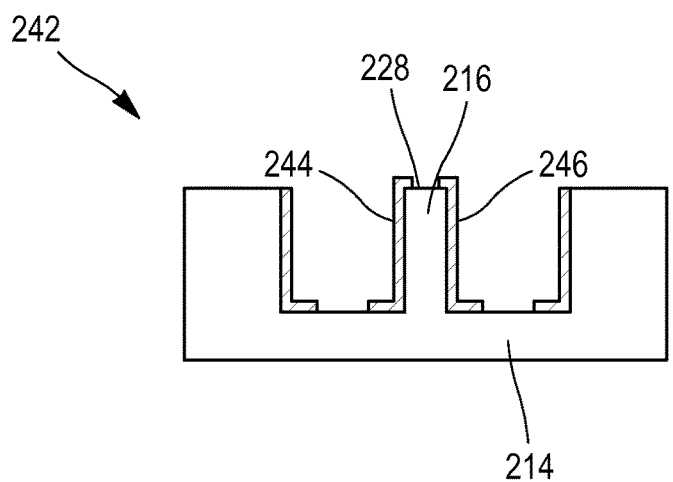

VOLUME WAVE RESONATORS ON MICROMACHINED VERTICAL STRUCTURES

BACKGROUND OF THE INVENTION

Field of the Invention

The present invention relates to bulk wave resonators of the plane-plane type, i.e. plate of piezoelectric material with metallized planar surfaces, and to the methods for manufacturing such resonators.

Description of the Related Art

Bulk wave resonators are widely used in multiple applications such as strong-coupling filters, high frequency resonators, temperature, acceleration sensors, gyrometers, torque sensors, gravimetric sensors, acousto-optical modulators with strong confinement and strong modulation.

The search for methods for manufacturing a large number of bulk wave resonators collectively on a monocrystalline plate remains a topical issue.

The methods developed up to now essentially consist of making use of methods for lapping/polishing plates, optionally stuck flat on a supporting substrate.

This approach is no doubt strongly efficient but does not allow easy control of plate thicknesses of less than 10 µm.

The technical problem is therefore to improve the manufacturing of plates with thicknesses of less than 10 µm, or in other words improve the manufacturing yield of bulk wave resonators of the plane-plane type on a same single-crystal wafer.

Relatedly, another technical problem is also to improve the integration of several bulk wave resonators of the plane-plane type on a same single-crystal wafer.

BRIEF SUMMARY OF THE INVENTION

For this purpose, the object of the invention is a bulk wave piezoelectric resonator operating at a predetermined frequency and comprising:

a block of substrate, as a holding means, having a plane face with a first thickness $e1$ along a normal of the plane face and consisting in a first material, and a resonant plate having first and second plane faces positioned facing each other, having a length L, a width l and a second thickness $e2$, and consisting in a second piezoelectric material, first and second metal electrodes covering at least partly the first face and the second face respectively of the resonant plate and located at least partly facing each other through the resonant plate, characterized in that the resonant plate is fixed perpendicularly in the vicinity of the plane face of the block of substrate so that the width of the resonant plate and the first thickness of the block of substrate have the same direction, and the first material, the second material, the first thickness of the block of substrate, the length, the width l, the second thickness of the resonant plate are configured for trapping bulk waves at the operating frequency of the resonator and for producing a bulk wave piezoelectric resonator of the plane-plane type, i.e. with bulk waves propagating in the direction of the thickness of the resonant plate.

According to particular embodiments, the resonator includes one or more of the following features:

a lateral form factor Fl, defined as the ratio of the width l of the resonant plate over the second thickness $e2$ of the resonant plate, is greater than or equal to 5, preferably greater than or equal to 10;

a longitudinal form factor, defined as the ratio of the length of the resonant plate over the thickness of the resonant plate, is greater than or equal to 5, preferably greater than or equal to 10;

the resonant plate and the block of substrate consist of a same piezoelectric material and forms a part in one piece;

the resonator comprises an attachment and/or acoustic insulation element at the operating frequency $f$, distinct from the block of substrate and from the resonant plate, consisting of at least one third material distinct from the first and second material, the attachment and/or acoustic insulation element being comprised in the group formed by a single adhesive layer, a Bragg mirror formed by a stack of layers with contrasting acoustic impedances;

the resonant plate and the block of substrate consist in a same piezoelectric material, and the crystallographic cut of the resonant plate along a plane parallel to its two faces is selected so that the electroacoustic coupling coefficient of the transducer formed by the resonant plate is greater than 0.0001 for bulk waves propagating in the direction of the thickness of the resonant plate;

the resonant plate has a constriction area in the direction of the thickness over the whole of its length for which the thickness of the resonant plate passes through a minimum and the resonant plate being attached to the block of substrate, the constriction area is located in the vicinity of the plane face of the block of substrate;

the first material is comprised in the set of materials formed by lithium niobate, lithium tantalate, potassium niobate, piezoelectric ceramics, quartz, lithium tetraborate, gallium orthophosphate, langasite, langatate, langanite, zinc oxide and aluminum nitride;

the second material is comprised in the set of materials formed by lithium niobate, lithium tantalite, potassium niobate, piezoelectric ceramics, quarts, lithium tetraborate, gallium orthophosphate, langasite, langatate, langanite, diamond carbon, silicon, sapphire;

the metal electrodes are made in a material comprised in the set of materials formed by aluminum, copper, titanium, platinum, iridium, zirconium, rubidium, molybdenum, nickel, tungsten, gold, polysilicon, alloys of these different metals, and their thickness is distributed so as to obtain a mass distribution localized at the boundary of the resonant plate and of the block of substrate so as to trap and concentrate the bulk waves inside a local area of the resonant plate.

The object of the invention is also a method for manufacturing a bulk wave resonator operating at a predetermined frequency comprising the following steps:

providing an initial resonant plate crude layer, the initial resonant plate crude layer consisting in a piezoelectric material, having a crude layer thickness eb, and spatial extension in a plane perpendicular to the direction of the thickness clearly larger than the thickness eb of the crude layer, the crystallographic orientation of the crude layer having been selected beforehand so that there exists a crystallographic cut plane of the crude layer in the direction of the thickness eb for which a wafer, cut along the cutting plane and having a thickness $e2$, produces a piezoelectric resonator of the plane-plane type with bulk waves propagating in the direction of the thickness of the wafer, with an electro-acoustic coupling coefficient greater than or equal to 0.0001;

cutting out in the direction of the thickness of the crude layer and partially or totally in the initial resonant plate crude layer, a resonant plate having a resonant plate thickness e2, first and second plane faces positioned facing each other, the plane faces having a length L, a width l and, the cutting out being performed by a machining method along the cut plane direction, the width l of the plate and the thickness of the crude layer being of the same direction, the material and the crystallographic orientation of the crude layer, the direction of the cutting plane, the length L, the width l, the second thickness of the resonant plate being configured for trapping bulk waves at the operating frequency of the resonator and for producing a bulk wave piezoelectric resonator of the plane-plane type, i.e. with bulk waves propagating in the direction of the thickness of the resonant plate; and depositing first and second metal electrodes covering at least partly the first face and the second face of the resonant plate respectively, and located at least partly facing each other.

According to particular embodiments, the manufacturing method includes one or more of the following characteristics:

partly cutting out in the initial crude layer and in the direction of the thickness of the initial resonant plate crude layer, the resonant plate, the partial cutting-out in the direction of the thickness of the crude layer being performed by removing a first bar adjacent to the plate through the first face, and a second bar adjacent to the plate through the second face, so as to obtain the resonant plate and a block of substrate as the remainder of the crude layer after cutting out the bars, holding the plate and having a reference plane face, the plate being attached in one piece perpendicularly to the plane face of the block of substrate, the width l of the plate thus being a height of the plate relatively to the block of substrate;

providing a holding substrate crude layer having a holding substrate crude layer thickness and consisting in a substrate material, and positioning between the holding substrate layer and the plate crude layer at least one layer intended to form an attachment and/or acoustic insulation element at the operating frequency, distinct from the substrate crude layer and from the resonant plate crude layer, consisting in at least one third material distinct from the substrate crude layer material and distinct from the resonant plate crude layer, said at least one crude layer forming the attachment and/or acoustic insulation element being comprised in the group formed by a single adhesive layer, a Bragg mirror formed by a stack of layers with contrasting acoustic impedances, cutting out at least the plate crude layer over a certain depth so as to form the resonant plate; and the step for cutting out the resonant plate is achieved by sawing.

BRIEF DESCRIPTION OF THE DRAWINGS

The invention will be better understood upon reading the description of several embodiments which follows, only given as an example and made with reference to the drawings wherein:

FIG. 8 is a view of a first intermediate state of the resonator of FIG. 1 manufactured by the method of FIG. 7;

FIG. 9 is a view of a second intermediate state of the resonator of FIG. 1 manufactured by the method of FIG. 7;

FIG. 10 is a view of a third intermediate state of the resonator of FIG. 1 manufactured by the method of FIG. 7;

DETAILED DESCRIPTION OF THE PREFERRED EMBODIMENTS

Figure 1:
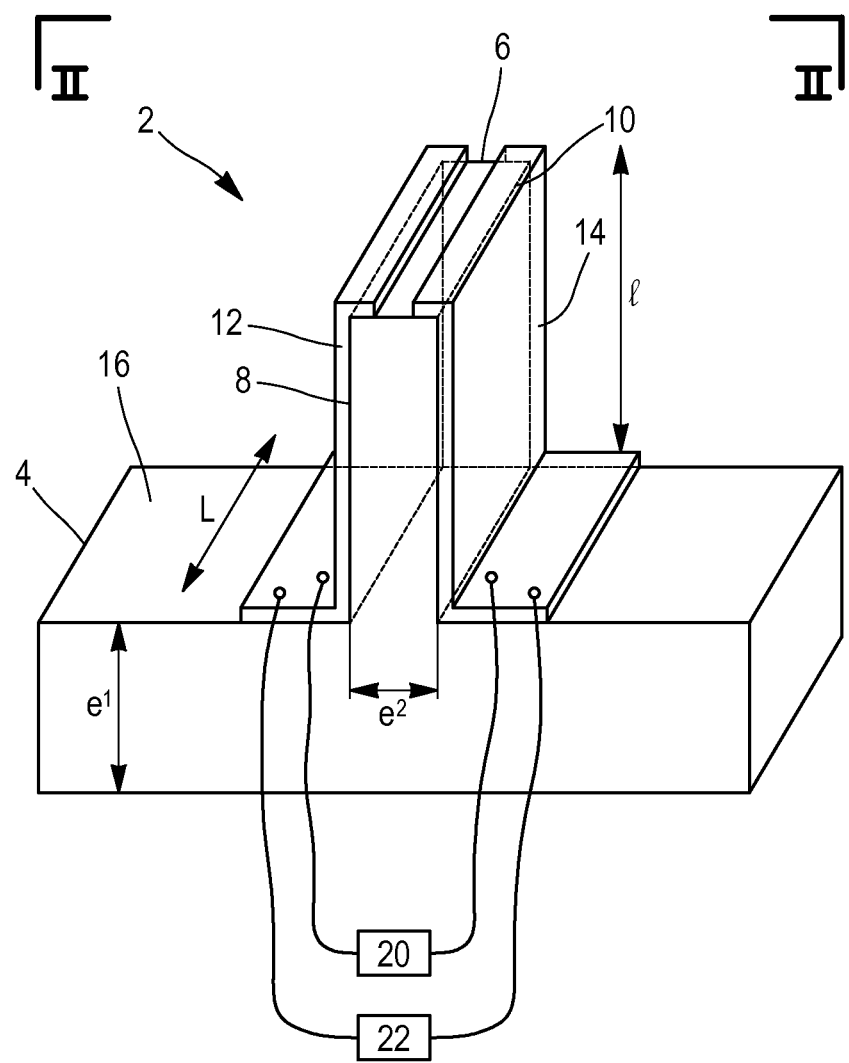
FIG. 1 is a view of a first embodiment of a bulk wave resonator in which the block of substrate and the resonant plate are in one piece.
Figure 2:
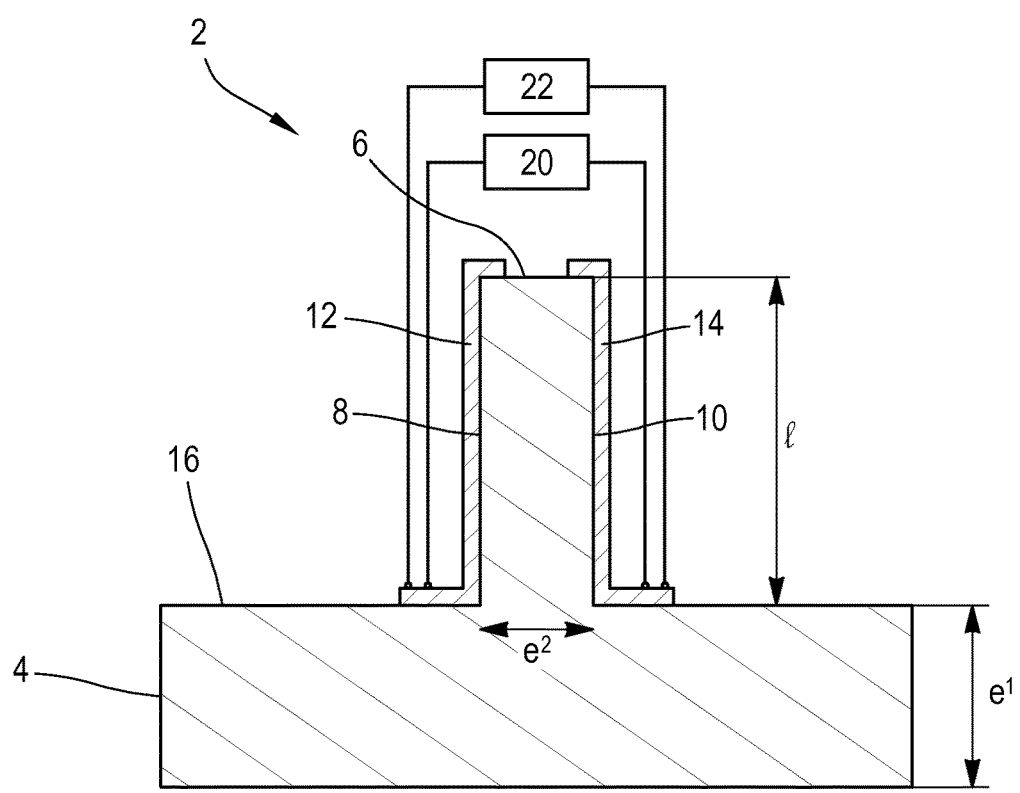
FIG. 2 is a cross-sectional view of the resonator of FIG. 1 in the direction of the thickness of the resonant plate along the cutting plane II-II of FIG. 1.

According to FIGS. 1 and 2, a bulk wave resonator 2 with a piezoelectric excitation mode, configured for operating at a predetermined desired frequency f, comprises a block of substrate 4, a resonant plate 6 having a first face 8 and a second face 10 facing each other, a first metal electrode 12 deposited on the first face 8 and a second metal electrode 14 deposited on the second face 10 of the resonant plate 6.

The block of substrate 4, consisting of a first material, includes a plane face 16 having a first thickness e1 along a normal of the plane face 16 and is used as a support for the resonant plate 6.

The resonant plate 6, consisting of a second piezoelectric material, is delimited by the first and second plane faces 12, 14. Both faces 12, 14 of the plate 6 are mutually parallel and spaced apart by a distance designated by e2, which distance forms the thickness of the resonant plate 6.

Each face 12, 14 of the resonant plate 6 has a length L and width l and a second thickness e2, and, Here, the first material and the second material are identical. For example the first and second materials are in lithium niobate.

According to FIGS. 1 and 2, the resonant plate 6 and the block of substrate 4 form a single part in one piece.

The first and second metal electrodes 12, 14 cover at least partly the first face 8 and the second face 10 of the resonant plate 6 respectively. In order to achieve excitation of the bulk waves within the resonant plate 6, at least one portion of the surfaces of both electrodes 12, 14 are superposed through the plate 6.

The underlying idea which led to the design of the resonator of FIG. 1 consists of thinning in one way or another a crude block of substrate with a globally parallelepipedal initial shape and surrounding the plate, according to lateral dimensions, i.e. here the thickness of the substrate, for producing a resonator in the form of a plate or bar perpendicularly attached to the substrate.

According to this idea, all the cuts of crystalline piezoelectric materials which may be used for bulk wave applications may be used, taking into account the fact that the reference crystalline orientation for applying the resonator is the one defined by the extension planes of both faces of the resonant plate.

Here, according to FIGS. 1 and 2, as an example, the resonant plate is cut out along a cut noted as (YXl)/38° according to the IEEE Std-176 standard revised in 1949, in a crude substrate precut out along a lithium niobate cut noted as (YXI)/128°. The cutting out of the resonant plate is carried out while assuming that the electric excitation is applied between both flank faces of the plate and the direction of propagation of the bulk waves is directed along the normal to the two faces of the plate. The plate has a thickness e2 of 5 µm and a width l of 25 µm.

The cut (YXl)/128° of the crude substrate is selected for its availability since this is a standard for lithium niobate on the one hand, and for the proximity of its orthogonal cut (YXI)/38° with a particularly favorable cut for bulk waves, the cut (YXl)/36°. On this cut (YXI)/36°, only the longitudinal mode is coupled with a maximum electromechanical coupling $k_s^2$ of 20%.

The thereby micro-machined plate on a lithium niobate cut (YXl)/128° forming a substrate is therefore equivalent to a configuration of a bulk wave resonator on a cut (YXl)/38°, i.e. 128° plus or minus a rotation of 90° by design, which places us very close to the optimum at (YXl)/36°.

It should be noted that when the form factor of the plate, designated by FI and equal to the ratio of the width of the plate l over the second thickness, has a small value, here equal to 5, the relevant structure is notably penalized by a parasitic mode at 660 MHz with a low quality coefficient which perturbs the relevant longitudinal mode only useful within the scope of the application of the resonator.

In order to improve this state of things several solutions exist.

A first solution consists of extending the width l of the plate in order to promote establishment of the useful resonant longitudinal mode between both faces and minimize the portion of acoustic energy in the vicinity of the block of substrate.

This solution proves to be highly effective and better results, in terms of a very well resolved longitudinal mode resonance and with a very pure spectral response, are obtained when for example the form factor FI is equal to 15, this case corresponding to a thickness e2 of 5 µm and a width l of 75 µm.

With this higher form factor, the electromechanical coupling is always 19% and the quality coefficient increases for the longitudinal mode.

When the form factor FI is still higher, for example equal to 200, the spectral purity of the resonator is improved. For a block of substrate in lithium niobate cut along the cut YXlt/126°/90°, a particular marked resonance with coupling slightly greater than 20% is obtained.

Thus, when the form factor FI is sufficiently high, the quality coefficient of the resonance is only limited by the intrinsic properties of the material forming the resonant plate alone and not by the effects of loss by acoustic radiation in the block of substrate.

The second material making up the resonant plate is comprised in the set of materials formed by lithium niobate, lithium tantalite, potassium niobate, piezoelectric ceramics, quartz, lithium tetraborate, gallium orthophosphate, langasite, langatate, langanite.

Alternatively, the piezoelectric material of the resonant plate, its crystallographic cut and its thickness are selected so as to allow generating and maintaining bulk waves by the plate, propagating in the direction of the thickness of the plate and with transverse polarization.

As an example, in the case of making use of the AT cut of quartz, noted as (YXI)/36° according to the IEEE Std-176 standard revised in 1949, the cutting out of the plate will be carried out from a crude quartz block forming the precut substrate along a cutting slice noted as (YXI)/126° or further (YXI)/−54°.

Generally, the resonant plate is attached perpendicularly to the vicinity of the plane face of the block of substrate so that the width of the resonant plate and the first thickness of the block of substrate have a same direction.

Generally, the first material, the second material, the first thickness e1 of the block of substrate, the length L the width l, the second thickness e2 of the resonant plate 6 are configured for trapping bulk waves at the operating frequency of the resonator and for producing a bulk wave piezoelectric resonator of the plane-plane type, i.e. with bulk waves propagating in the direction of the thickness of the resonant plate.

During operation, the resonator is connected to the output of an electric excitation source 20 and to the input of a circuit 22 for extracting a useful signal at the resonance and working frequency f, the extraction circuit 22 forming an output load.

The electric excitation source 20, connected between the first electrode 12 and the second electrode 14 is configured for generating a voltage signal having a main sinusoidal component at the working frequency f.

The extraction circuit 22 also connected between the first electrode 12 and the second electrode 14 is configured for extracting a useful signal at the working frequency f.

Figure 3:
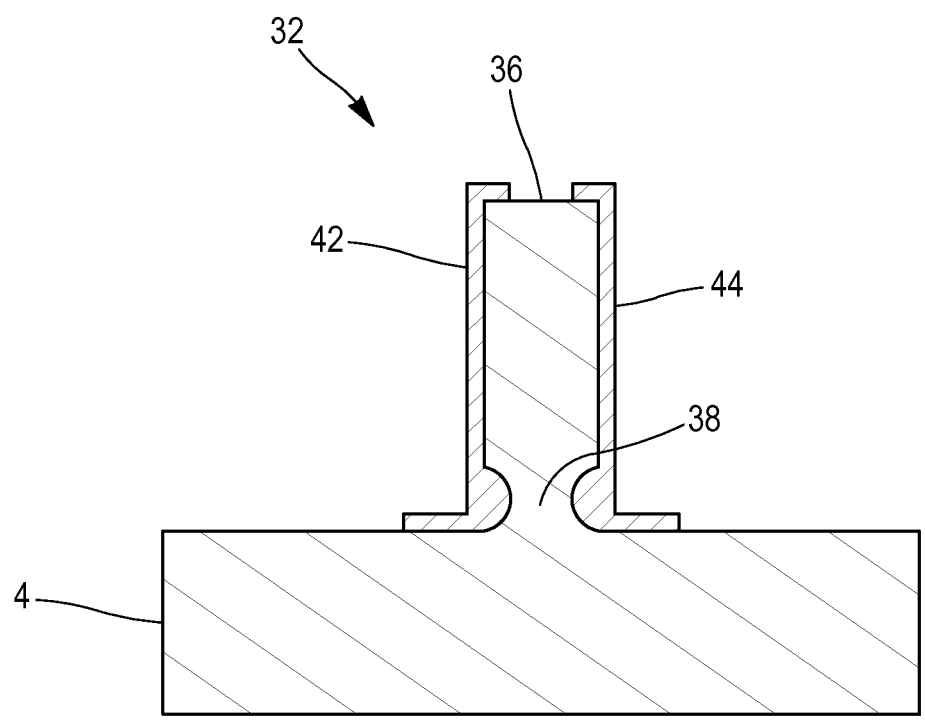
FIG. 3 is a cross-sectional view in the direction of the thickness of the resonant plate of a second embodiment derived from a bulk wave resonator of FIG. 1 wherein a bottleneck separates the plate from the block of substrate.

According to FIG. 3, a second embodiment of a resonator 32, derived from the resonator 2 of FIG. 1 comprises a resonant plate attached in one piece to the block of substrate.

The materials used and the geometrical dimensions of the resonant plate and of the block of substrate in terms of thickness e1, length L and width l are identical with those of the resonator 2 of FIG. 1.

The resonant plate, here designated with the numerical reference 36, has a constriction area 38 in the thickness of the plate in the direction of the width l over the whole of its length L.

In the constriction area 38, located in the vicinity of the plane face 16 of the block of substrate 4, the thickness of the plate 36 varies and passes through a minimum.

The thinning of the plate formed by the constriction area 38, used at the base of the resonant plate 36, gives the possibility of insulating at best the maximum vibration area inside the plate 36 fitted into the substrate 4.

In this embodiment, the structure is called a bottleneck structure by analogy with the narrow shape of a bottleneck.

This structure was validated for a form factor FI of 15 as contemplated for the resonator of FIG. 1, i.e. a width l of the plate of 75 μm for a thickness e2 of 5 μm.

First and second electrodes 42, 44 each cover a different face of the plate 36 and fill at the foot of the plate the depression formed by the constriction area of the plate.

Figure 4:
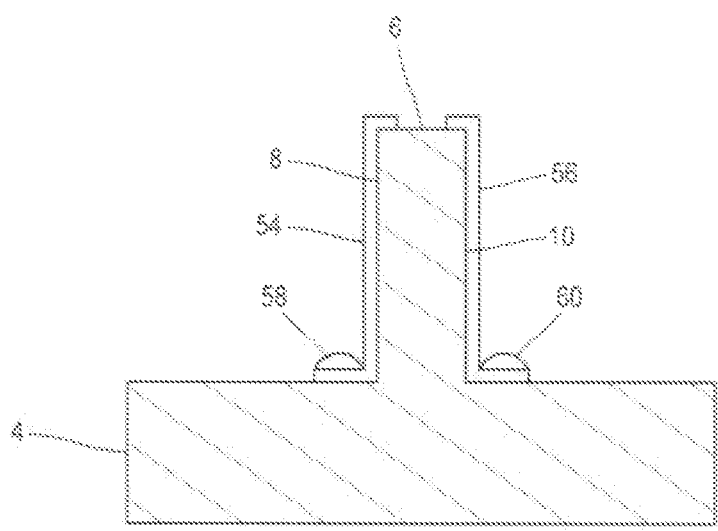
FIG. 4 is a cross-sectional view in the direction of the thickness of the resonant plate of a third embodiment of a resonator, derived from the resonator of FIG. 1, which applies increased metallization at the electrodes on the upper portion of the substrate.

According to FIG. 4, a third embodiment of a resonator, derived from the resonator 2 of FIG. 1, applies increased metallization at the electrodes on the upper portion of the substrate.

In this embodiment only the first and second electrodes designated with the numerical references 54 and 56, differ from the electrodes 12 and 14 of the resonator 2 of FIG. 1 in that they each comprise a different bulge 58, 60 i.e. an addition of metal.

The electrodes 54, 56 are configured through this addition of metal in order to obtain a mass effect on the upper portion of the substrate and localize the maximum of the amplitude of the acoustic vibration far from the fitting of the plate 6 into the substrate 4.

Alternatively, this mass effect may also be obtained by doping the upper portion of the substrate. For most single-crystal materials, there exist doping methods giving the possibility of substituting, or even integrating within the lattice, atoms foreign to the crystalline structure in order to locally modify the properties of the material.

A method particularly used in optics with lithium niobate relates to proton exchange which allows diffusion of light atoms (hydrogen, titanium, etc.) within the crystalline lattice with or without structural modifications. This method is for example described in the article of Toshiaki Suhara, Shuji Fujiwara and Hiroshi Nishihara entitled <<Proton-exchanged Fresnel lenses in TiLiNbO$_3$ waveguides>>, Applied Optics, Vol. 25, Issue 19, pp. 3379-3383 (1986).

It is also possible to substitute heavier atoms (erbium, MgO, etc.) within the crystalline lattice by high temperature diffusion. Such a method is described in the thesis of Arnaud Grisard entitled <<Lasers guides d'ondes dans le niobate de lithium dope en Erbium>>, (Laser wave guides in erbium-doped lithium niobate), University of Nice-Sophia Antipolis, U.F.R. Faculté des Sciences, 1997. It is thus possible to locally modify the elastic properties by modifying the mass density and thus create required guiding conditions depending on the selected crystalline orientation.

Figure 5:
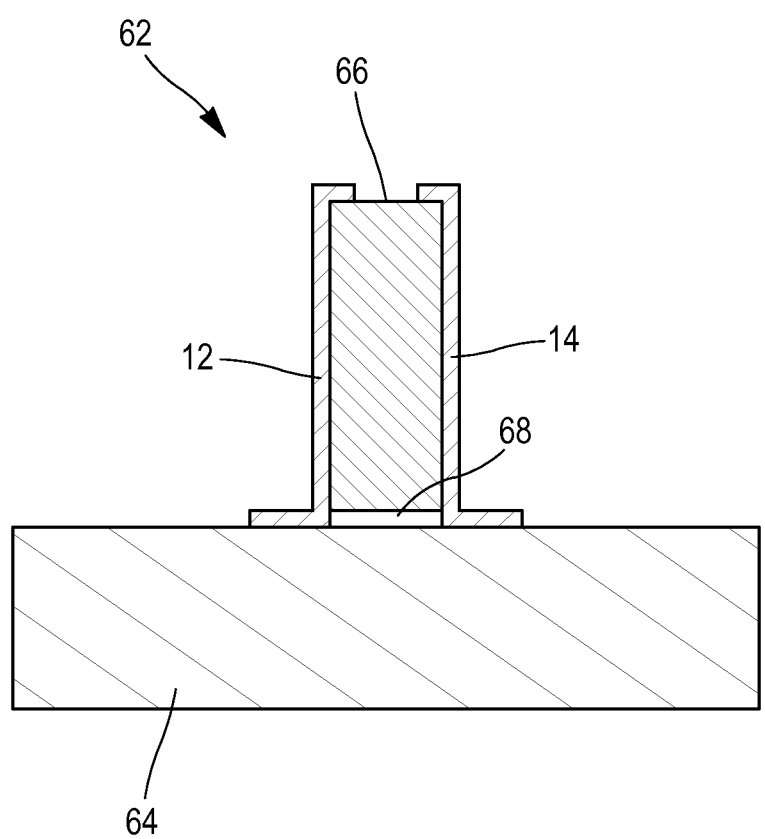
FIG. 5 is cross-sectional view in the direction of the thickness of the resonant plate of a fourth embodiment of a bulk wave resonator, with a geometrical shape identical with that of the resonator of FIG. 1, in which an attachment element connects the resonant plate to the block of substrate.
Figure 6:
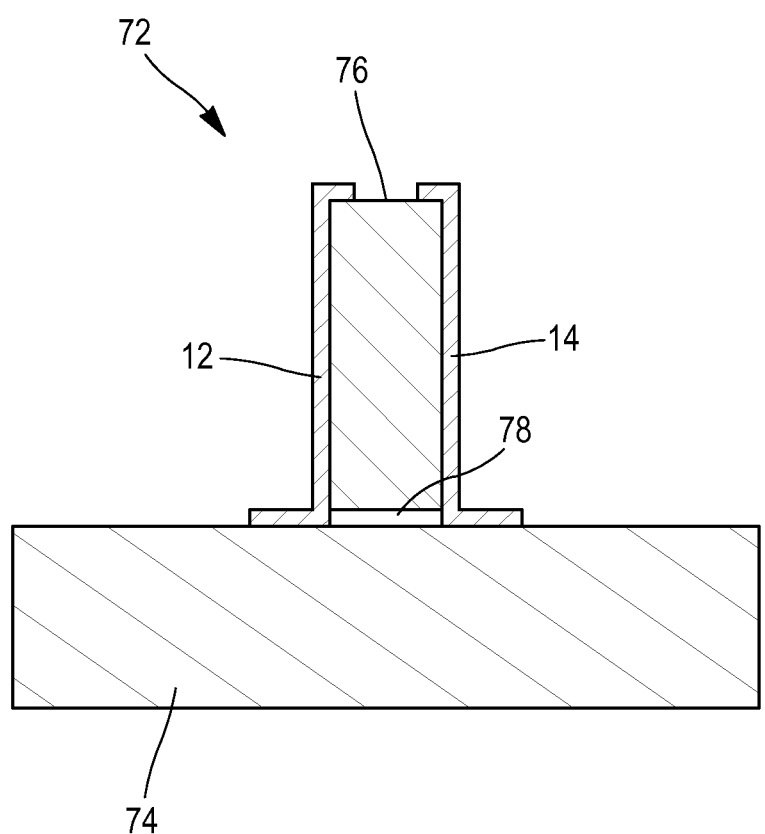
FIG. 6 is a cross-sectional view in the direction of the thickness of the resonant plate of a fifth embodiment of a bulk wave resonator, with a geometrical shape identical with that of the resonator of FIG. 1, in which an acoustic insulation element connects the resonant plate to the block of substrate.

According to FIGS. 5 and 6, other structures of resonators allow improvement in the trapping of the bulk wave in the resonant plate.

According to FIG. 5, a fourth embodiment of a resonator 62 comprises a block of substrate 64 and a resonant plate 66 for which the materials are different.

The material of the resonant plate 66 has piezoelectric properties.

The shape and the geometrical dimensions of the block of substrate 64 and of the plate 66 are identical with those of the block of substrate 4 and of the resonant plate 6 of FIG. 1.

According to FIG. 5, the block of substrate 64 and the resonant plate 66 are distinct parts connected with each other through a binding element 68 such as for example here an acoustically transparent adhesive joint. An adhesive joint may be understood as a polymeric layer, deposited for example by centrifugation, and cross-linked in order to generate a solid bond between the material of the plate 66 and the material of the block of substrate 64, or further metal layers, deposited on the faces to be adhesively bonded and used for transfer by inter-metal diffusion, Au, In, Cu being the materials most used for this purpose, insofar that these layers will not short-circuit the facing electrodes deposited on the flank faces of the resonant plate 66, or further silica layers deposited on the faces to be adhesively bonded and activated so that their hydrophilicity allows molecular bonding as applied for so-called SOI (Silicon-On-Insulator, TM SOITEC) substrates.

The first material of the block of substrate 64 is selected so that the propagation velocities of the bulk waves propagating therein are greater than those of the second material.

For example, the second material forming the resonant plate 66 is lithium niobate or tantalite, quartz, langasite or any other single-crystal piezoelectric material, deposited on a diamond carbon layer or if necessary more simply on silicon or sapphire forming the first material of the block of substrate.

According to FIG. 6, a fifth embodiment of a resonator 72, derived from the resonator of FIG. 5 comprises a block of substrate 74 and a resonant plate 76 for which the materials are identical.

The resonator 72 comprises an acoustic insulation element 78, positioned between the block of substrate 74 and the resonant plate 76, and attached to the latter with two adhesive joints not shown in FIG. 6.

The acoustic insulation element 78 is here a Bragg mirror, made here with a stack of layers of strongly contrasting acoustic impedances.

The strongly contrasting acoustic impedance layers are for example layers of aluminum nitride or silicon nitride and silicon oxide, the stack being configured for reflecting in phase and completely the bulk waves at the contemplated working frequencies.

Alternatively, the first material making up the substrate and the second material forming the plate are different.

The embodiments of FIGS. 5 and 6 may be generalized by considering that the resonator comprises an attachment and/or acoustic insulation element distinct from the block of substrate and from the resonant plate, consisting of at least one third material distinct from the first and second material, the attachment and/or acoustic insulation element being comprised in the group formed by a single adhesive layer, a Bragg mirror formed with a stack of contrasting acoustic impedance layers.

Figure 7:
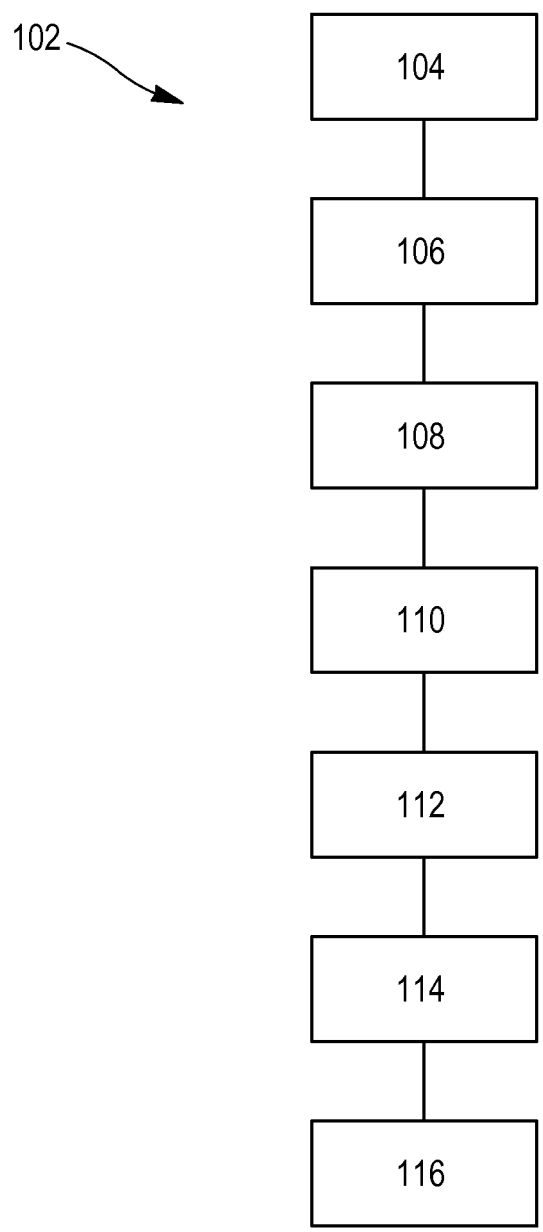
FIG. 7 is a flow chart of a method for manufacturing the resonator of FIG. 1.

According to FIG. 7, a complete method 102 for making a resonator of FIG. 1, including at least one resonant plate connected in one piece and mounted perpendicularly on a block of substrate, comprises a series of steps 104, 106, 108, 110, 112, 114, 116.

The micro-manufacturing steps are applicable for any lithium niobate or lithium tantalite cut.

Here, the initial raw material of the method is a slice of lithium niobate called a <<wafer>>.

Generally, under the cover of determining the suitable sawing conditions, the method is applicable to any single-crystal material, in particular piezoelectric material.

The use of a blade capable of polishing the faces in the same time as the cutting provides the possibility of making faces compatible with the excitation and reflection of effective bulk waves in the sense of resonance quality. The resulting surface should have roughness from a few tens to a few RMS nanometers, ideally an optical polish. In any case, roughness of the surfaces of the resonator of more than 100 nm RMS is not compatible with quality of the resonance compliant with the standard of acousto-electricity.

The use of a precision saw, for example a saw of the Disco® brand gives the possibility with two saw cuts of defining both planes of the faces of the resonant plate.

The thickness e2 resolution of a resonant plate is defined by the precision in the alignment between these saw cuts and may attain 1 μm in the best of cases.

The width $\underline{l}$ of the resonant plate is defined, as for it, by the required cut depth in the direction of the thickness of the block of substrate formed by the lithium niobate wafer and may attain several hundred μm.

In a first step 104, a lithium niobate wafer is provided, for which the initial cut is noted as (YXwl)ϕ/θ+90° in the direction of the thickness with a first upper face and a second lower face.

In a second step 106, the upper face of the lithium niobate wafer is coated with resin, for example the resin S 1828 of the Shipley brand. The deposition of the resin is carried out for example with a method of the spin coating type over a thickness of 2.5 μm. In the same step 106, the resin is crosslinked in an oven for one hour at 95° Celsius in order to evaporate the solvents and to thereby make it more resistant to the cutting step with the saw.

In a third step 108, one plate or several resonant plates are cut up. For configuring the sawing of a plate, here at least four saw cuts are required in order to produce the plate. Indeed, the width of the blade of the saw is of 200 μm, two superposed saw cuts are made in order to obtain an accessible gap of 350-400 μm on either side of the plate in order to allow tests under probe tips.

During the third step 108, the thickness e2 and the width $\underline{l}$ of at least one plate are defined by the depth of the cutouts and the precision in the alignment in the series of two saw cuts as well as the width of the electrodes by the superposition of two saw cuts.

Once the third step 108 is carried out, in a fourth step 110 at least one strip in the direction of the length on each free face of the top of the plates as well as strips in the direction of the length on floor faces of the substrate located between the plates are covered with the protective resin S 1828.

In a fifth step 112, metal electrodes are deposited on the side faces, i.e. the flanks of the plates, as well as at the bottom of the trenches with a width comprised between 350-400 μm over a length L which may attain several centimeters.

In order to cover the flanks of a plate or of a series of plates, a slot over a width $\underline{l}$ may attain several hundred μm, deposition of aluminum is achieved by sputtering in three times by tilting the chip, formed by the substrate and the plates, for example by twice 45° around an axis oriented in the direction of the length L of the plates.

In this fifth step 112, the entire chip is covered with the aluminum layer and the electrodes are then obtained by the so-called lift-off technique, i.e. detachment. For this, the chip is immersed into a solvent bath (remover), for example the remover 1165, a chemical solution dissolving the protective resin, here the resin S 1828, heated to 70° for several hours.

The lift-off is then accelerated and achieved by using an ultrasonic bath for one minute. This step in particular allows removal of the resin localized on the crest of the plate and insulation of the electrodes deposited on the facing faces of the resonant plate.

Next, in a sixth step 114, in order to solidify the plates or bars before a seventh step 116 for longitudinally cutting out resonant plates, the plates or bars are coated with a protective resin S1805 by means of the spray coating technique. This sixth step 114 gives the possibility of covering with resin the structured niobate wafers i.e. the chips provided with their electrodes.

The seventh and last step 116 consists of defining the length L of the plates or bars by cutting with the saw, for example here in our case, a length L of 500 μm. This seventh step 116 is rather critical and may cause breakage and therefore the loss of many plates. Indeed, the question here is to produce saw cuts perpendicular to the slotted surface every 500 μm along the direction of the length L and over a depth greater than the first cutting depth, i.e. the width l of the plates, in order to make every thereby formed elementary chip electrically independent.

According to FIG. 8, a first intermediate state 202 of the resonator 2 of FIG. 1, obtained at the end of the second step 106 of the method 102, is a stack of a layer 204 of resin S1828 and of a crude wafer 206 of lithium niobate.

According to FIG. 9, a second intermediate state 212 of the resonator of FIG. 1 manufactured by the method 102, obtained at the end of the third sawing step 108 comprises a block of substrate in which was machined a plate 216 surrounded on either side by a recess or a naked i.e. exposed valley 218, 220. Two end bars 222, 224 of the block 214 surround the plate 216 which here is unique. A resin layer 226 is deposited on a top face 228 of the plate and on top faces 230, 232 of the bars 222, 224 as well as on two bands of recesses 234, 236 positioned on either side of the plate 216.

According to FIG. 10, a third intermediate state 242 of the resonator of FIG. 1 manufactured by the method 102, obtained at the end of the lift-off step 112 for depositing the electrodes is a structured chip.

Here, the chip 242 comprises a single resonant plate 216 with two electrodes 244, 246 in aluminum on either side of its two flanks, each electrode 244, 246 slightly jutting out on the top face 228 of the plate 216 and on a portion of the floor face of the substrate 214 at the foot of each flank of the resonant plate 216.

This structure after cutting out the edges of the substrate, corresponds to the structure of the resonator of FIG. 1.

Figure 11:
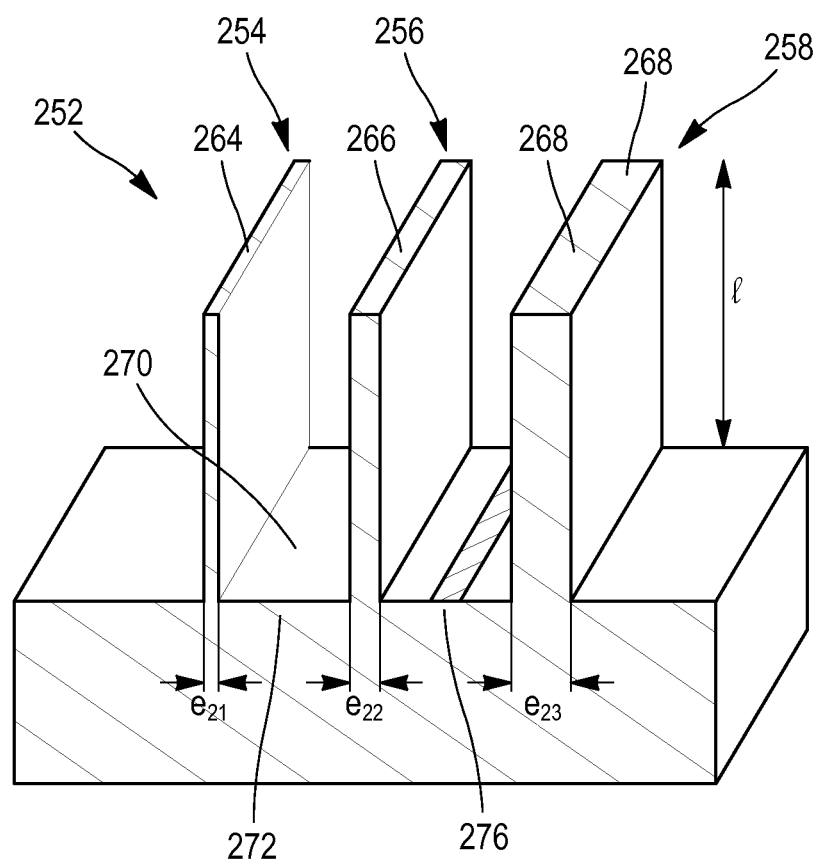
FIG. 11 is a view of a chip integrating onto a same substrate, a set of several resonators described in FIGS. 1 to 6.

According to FIG. 11, a chip 252 forming a resonant complex surface comprises three elementary resonators 254, 256, 258 each formed by a different resonant plate 264, 266, 268. Each resonant plate 264, 266, 268 of the same width $\underline{l}$ has a different thickness e21, e22, e23.

The first two resonant plates 264, 266, shown on the left in FIG. 11, are coupled with each other by sharing a same electrode 270 made by a metal connection deposited on a common substrate floor 272.

The first two resonant plates 264, 266 are electrically separated from the third plate 268 by an insulating strip 276.

Figure 12:
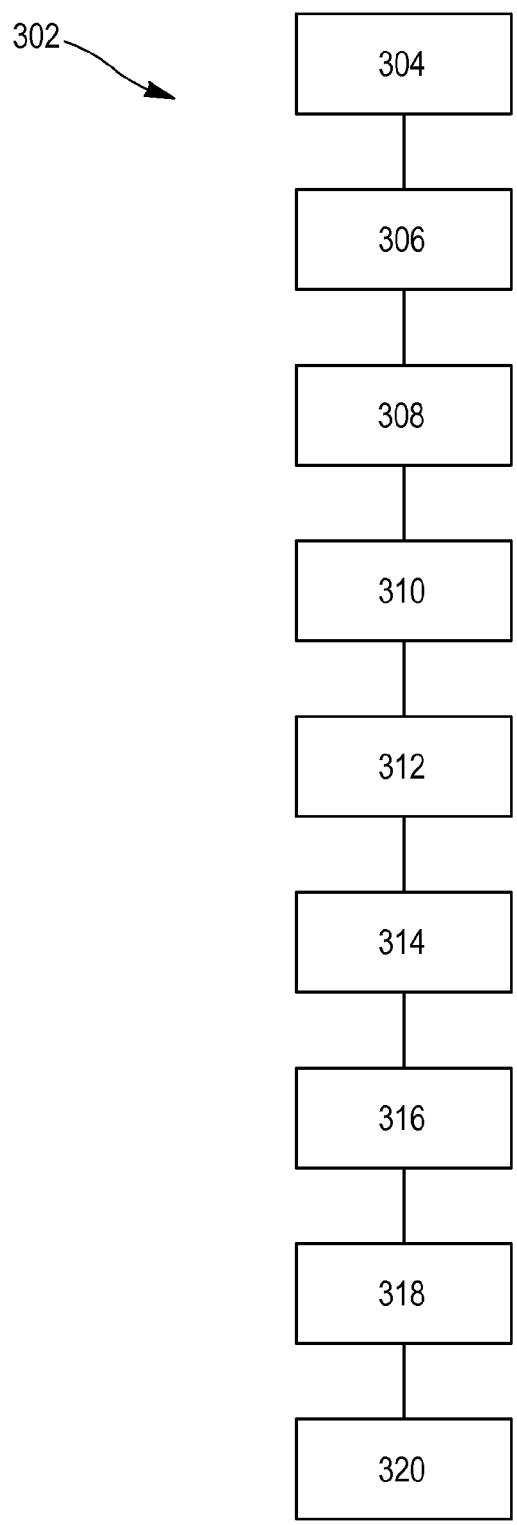
FIG. 12 is a flow chart of a method for manufacturing the resonator of FIG. 5 or of FIG. 6.

According to FIG. 12, a complete method 302 for making a resonator of FIG. 5 or FIG. 6, including at least one resonant plate, connected through an attachment and/or acoustic insulation means while being mounted perpendicularly on a block of substrate, comprises a series of steps 304, 306, 308, 310, 312, 314, 316, 318, 320.

Here, the attachment and/or acoustic insulation means is a Bragg mirror, positioned between the resonant plate and the substrate. The Bragg mirror is made here by a stack of layers of strongly contrasting acoustic impedances, layers of aluminum nitride or silicon nitride and silicon oxide for example, the stack being configured for reflecting in phase and completely the bulk waves at the contemplated working frequencies.

In a first step 304, a lithium niobate wafer is provided for which the initial cut is noted as (YXwl)φ/θ+90° in the direction of the thickness with a first upper face and a second lower face.

In a second step 306, a Bragg mirror is positioned on the upper face of the lithium niobate substrate, the surface of the mirror having a sufficient extent for insulating a significant number of resonant plates.

The mirror is made here by a stack of strongly contrasting acoustic impedance layers and of large extent, aluminum nitride or silicon nitride and silicon oxide layers for example, the stack being configured for reflecting in phase and completely bulk waves at the contemplated frequencies.

The Bragg mirror is attached to the substrate by an adhesive bonding method with preliminary deposition of an adhesive joint. This mirror then consists of a stack of material transferred according to the method described for FIG. 5 (polymeric adhesive bonding, metal diffusion, molecular bonding) and thinned for attaining required thicknesses, which may notably vary depending on the targeted working frequency. More particularly, for radiofrequency applications, the required layer thicknesses may prove to be compatible with physical or chemical, plasma-assisted deposition methods, in solid or vapor phases (evaporation, sputtering, chemical vapor deposition, molecular jets, etc.), giving rise to stacks of layers from a few micrometers each to within a fraction of a μm. It is thus possible to make multiple layers having controlled thicknesses and giving rise to a mirror of great reflection efficiency, close to that of an air gap.

In a third step 308, a layer of a piezoelectric transducer is deposited on the Bragg mirror. A crystallographic orientation of the transducer is selected so that, when the layer is cut out along the direction of the thickness of the substrate through two planes parallel with each other and with a suitably selected normal direction, the electroacoustic coupling coefficient is large, favorable to generating and maintaining acoustic bulk waves between the cutting planes of the transducer.

Here, it is assumed that the material is the same as the material of the substrate, i.e. lithium niobate, and that the crystallographic orientations are the same during the stacking. Thus, the electric transducer cut is (YXwl)φ/θ+90°, it being considered that a cut (YXwl)φ/θ during the cutting out of the plates has a strong electroacoustic cutting coefficient compatible with the sought application, i.e. large for wide band filtering, i.e. greater than 5%, intermediate or even moderate for applications with narrow band filters or a resonator, i.e. comprised between 5% and 0.0001.

For example, the initial crude slice or wafer is cut into two equal portions, a first portion being used as a substrate, a second portion being used as a transducer.

The attachment of the transducer layer onto the Bragg mirror is achieved by means of an adhesive joint for example.

In a fourth step 310, similar to the second step 106 of the method 102, the upper face of the lithium niobate wafer forming the transducer is coated with a resin, for example resin S 1828 of the Shipley brand. Deposition of the resin is carried out for example with a spin coating method over a thickness of 2.5 μm. In the same step, the resin is annealed in an oven for one hour at 95° Celsius in order to evaporate the solvents and to make it thus more resistant to the saw cutting step.

In a fifth step 312, similar to the third step 108 of the method 102, a plate or several plates are cut out in the stack along parallel planes, the direction of which corresponds to the desired cut (YXwl)φ/θ.

In order to configure the sawing of a resonant plate, here, at least four saw cuts are required for making the plate. Indeed, as the width of the saw blade is 200 μm, two superposed saw cuts are made in order to obtain an accessible gap of 350-400 μm on either side of the plate for allowing tests under probe tips.

During the fifth step 312, the thickness e2 and the width $\underline{l}$ of at least one plate are defined by the depth of the cuts and the precision in the alignment between the series of two saw cuts as well as the width of the electrodes by superposition of two saw cuts.

Once the fifth step 312 has been carried out, a sixth step 314, identical with the fourth step 110 of the method 102 is carried out.

In a seventh step 316, identical with the fifth step 112 of the method 102, metal electrodes are deposited.

Next, in an eighth step 318, the plates or bars are coated with protective resin S1805 by means of the spray coating technique. This eighth step gives the possibility of covering with resin, the structured niobate wafers, i.e. the chips provided with their electrodes.

The ninth and last step 320 consists of defining the length L of the plates or bars by cutting with the saw, for example here in our case a length L of 500 μm.

Figure 13:
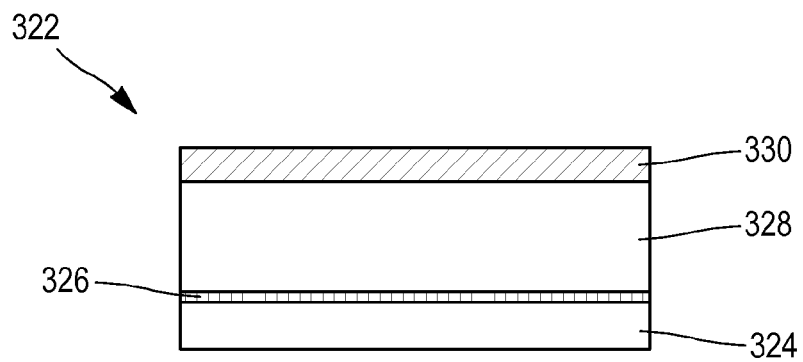
FIG. 13 is a view of a first intermediate state of the resonator of FIG. 5 or of FIG. 6 manufactured by the method of FIG. 12.

According to FIG. 13, a first intermediate state 322 of the resonator of FIG. 5, obtained at the end of the second step 306 of the method 302, is a stack of a first crude lithium niobate wafer 324 intended to form the holding substrate, of a layer 326 forming a Bragg mirror hemmed in with two adhesive joints, of a second crude lithium niobate wafer 328 intended to form at least one resonant plate after machining, and a layer 330 of S1828 resin.

Figure 14:
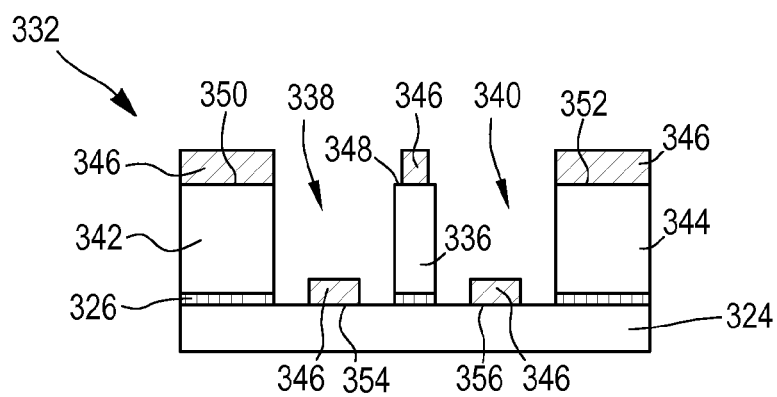
FIG. 14 is a view of a second intermediate state of the resonator of FIG. 5 or of FIG. 6 manufactured by the method of FIG. 12.

According to FIG. 14, a second intermediate state 332 of the resonator of FIG. 5, obtained at the end of the third sawing step 308 comprises the block of substrate 324, a plate 336 machined in the whole of the layers 326, 328, 330, surrounded on either side by a recess or a naked i.e. exposed valley 338, 340. Two end bars 342, 344 of the chip 332 surround the plate 336 which here is unique. A resin layer 346 is deposited on one top face 348 of the plate 336 and on top faces 350, 352 of the bars 342, 344 as well as on two bands of recesses 354, 356 positioned on either side of the plate 336.

Figure 15:
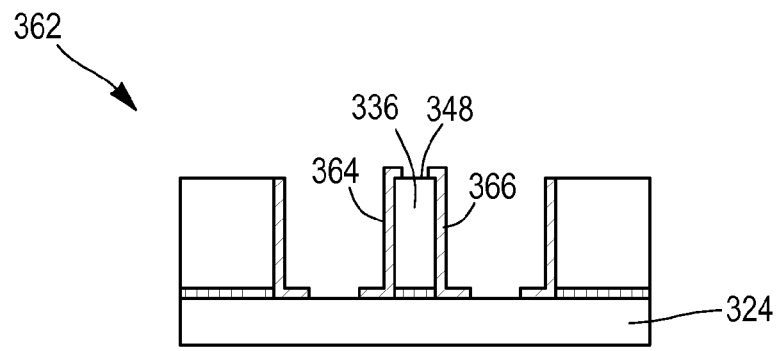
FIG. 15 is a view of a third intermediate state of the resonator of FIG. 5 or of FIG. 6 manufactured by the method of FIG. 12.
Figure 16:
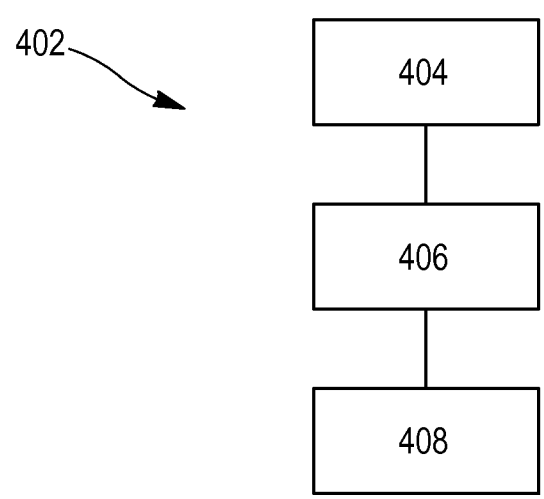
FIG. 16 is a flow chart of a manufacturing method generalizing the manufacturing methods 7 and 12.

According to FIG. 15, a third intermediate state 362 of the resonator of FIG. 1, obtained at the end of a lift-off step for depositing electrodes is a structured chip.

Here, the chip 362 comprises a single resonant plate 336 with two electrodes 364, 366 in aluminum on either side of its two flanks, each electrode 364, 366 slightly jutting out on the top face 348 of the plate 336 and on a portion of the floor face of the substrate 324 at the foot of each flank of the resonant plate 336.

This structure after cutting out the edges of the substrate corresponds to the structure of the resonator of FIG. 5.

Generally, a method 402 for manufacturing a resonator described in FIGS. 1 to 6 comprises three steps 404, 406, 408.

In a first step 404, an initial resonant plate crude layer is provided, the initial resonant plate crude layer consisting of a piezoelectric material, having a crude layer thickness eb, and a spatial extent in a plane perpendicular to the direction of the thickness clearly larger than the thickness eb of the crude layer. The crystallographic orientation of the crude layer having been selected beforehand so that there exists a crystallographic cutting plane of the crude layer in the direction of the thickness eb for which a wafer, cut out according to the cutting plane and having a thickness e2, produces a piezoelectric resonator of the plane-plane type with bulk waves propagating in the direction of the thickness of the wafer, with an electro-acoustic coupling coefficient compatible with the sought application, i.e. large for intermediate or wide band filtering, or greater than 5%, intermediate or even moderate for applications with narrow band filters or a resonator, i.e. comprised between 5% and 0.0001.

In a second step 406, a resonant plate is cut out in the direction of the thickness of the crude layer and partly or totally in the initial resonant plate crude layer, the resonant plate having a resonant plate thickness e2, first and second plane faces positioned facing each other, the planar faces having a length L, a width l and the cutting out being carried out with a machining method along the direction of the cutting plane, the width l of the plate and the thickness of the crude layer being of the same direction, the material and the crystallographic orientation of the crude layer, the direction of the cutting plane, the length L, the width l, the second thickness of the resonant plate being configured for trapping bulk waves at the operating frequency of the resonator and for producing a piezoelectric resonator with bulk waves of the plane-plane type, i.e. bulk waves propagating in the direction of the thickness of the resonant plate.

In a third step 408, first and second metal electrodes are deposited covering at least partly the first face and the second face of the resonant plate, respectively. The respective surfaces of the first and second electrodes are at least partly facing each other through the resonant plate.

The applications used for the resonator described above are the following:
  resonators for RF frequency sources;
  resonators, elements of impedances for networking frequency filters (ladder or trellis filters);
  coupled resonators for polar frequency filters (by acting on the specific fringe of the bars by integrating therein a cut out or a mass overload localized for generating mode coupling conditions);
  resonators for sensors and particularly wireless sensors which may be queried through IFM (Industrial—Scientific—Medical) bands;
  resonators for high temperature sensors (on materials such as langanite and its derivatives, $GaPO_4$, ZnO or massive AlN, . . . );
  resonators for accelerometric, gyroscopic, gravimetric sensors;
  elements for modulating optical signals by acoustic-optical coupling.

The materials which may be utilized for these operations are lithium niobate, tantalite and potassium niobate for filters with strong coupling and (potentially piezoelectric ceramics and ceramic single-crystals of the relaxation type), quartz, lithium tetraborate, gallium orthophosphate ($GaPO_4$), langasite ($La_3Ga_5SiO_{14}$) and its many variants (langanate, langanite, etc.) as well as materials which are more delicate to elaborate in single-crystal form but for which the piezoelectric properties are advantageous for applications of elastic bulk waves, i.e. aluminum nitride (AlN) or zinc oxide (ZnO). For sensors and in particular for high temperature sensors (adequate electrodes selected for this type of application, i.e. platinum, iridium, zirconium or rubidium or any other electrodes notoriously robust at high temperatures for example obtained by alloying the materials mentioned above and optionally other metal bodies or metal oxides having conductivities comparable with those of an ideal metal and proved stability of said properties versus temperature), and generally any piezoelectric single crystal available in the form of a sufficiently thick plate (a minimum of 200 μm in a crude form, or a minimum of a few tens of microns if transferred onto a substrate according to the methods described above) in order to allow machining of the bars as shown.

The improvement of spectral purity also passes through optimization of the transverse geometry of the bars, notably by breaking the conditions for radial resonances and removal of the bar modes by apodization of the shape of the bar, the latter may be made on the initial wafer by corrugation for example, or chemical machining in order to avoid that the bars have homogeneous thickness which may promote such modes.

For lithium niobate and tantalite, it is possible to reduce the thermal sensitivity of the resonators by covering them with a deposit of amorphous silica, the temperature coefficient of the frequency is of positive sign and gives the possibility of compensating for the negative sign of that of the materials. The deposition may advantageously be carried out above the electrodes, for example by sputtering, in order not to induce any parasitic capacitance in the case when the silica deposit would have occurred before metallization.

A few examples of the most currently used material cuts for bulk wave applications should be recalled:
  Quartz: (YXl)/40° (plus or minus 5°) for the use of the BT cut, (YXl)/−54° (plus or minus 5°) for the use of the AT cut, (YXwl)/22°/46° (plus or minus 5° on each angle) for utilizing the SC cut.
  Lithium niobate: (YXl)/126° (plus or minus 5°) for utilizing the cut (YXl)/36° allowing the only excitation of a pure longitudinal bulk wave, (YXl)/73° (plus or minus 5°) for utilizing the cut (YXl)/163° allowing the sole excitation of a pure shear bulk wave, same crystalline orientations for lithium tantalite.

For a given surface, it is thus possible to multiply the number of resonators considerably according to at least by a factor 10 by utilizing cuts of the more advantageous single-crystal cuts in terms of electromechanical coupling for applications to frequency filters, in terms of temperature stability for applications with stable frequency sources, in terms of sensitivity to stresses for applications to sensors, generally by combining these diverse characteristics for producing a given application function.

The invention claimed is:
1. A bulk wave piezoelectric resonator operating at a predetermined frequency, the resonator comprising:
  a block of substrate with a plane face, the block of substrate having a first thickness along a normal to said plane face, and made of a first material;
  a resonant plate having first and second plane faces that are positioned facing each other, the resonant plate having a length, a width, and a second thickness, the resonant plate being made of a second material that is a piezoelectric material;

first and second metal electrodes at least partly covering the first face and the second face of the resonant plate, respectively, the first and second metal electrodes being located at least partly facing each other, through the resonant plate; and an attachment element and/or an acoustic insulation element at an operating frequency, distinct from the block of substrate and the resonant plate, the attachment element and/or the acoustic insulation element being made of at least one third material distinct from the first and second materials, the attachment element and/or the acoustic insulation element being comprised in a group comprising a single adhesive layer, a Bragg mirror formed by a stack of layers with contrasted acoustic impedances, wherein the resonant plate is attached perpendicularly to the vicinity of the plane face of the block of substrate so that the width of the resonant plate and the first thickness of the block of substrate have a same direction, and the first material, the second material, the first thickness of the block of substrate, the length, the width, and the second thickness of the resonant plate are configured to trap bulk waves at the operating frequency of the resonator and to produce a bulk wave piezoelectric resonator of the plane-plane type in which bulk waves propagate in the direction of the thickness of the resonant plate.

2. The bulk wave piezoelectric resonator according to claim 1, wherein a lateral form factor, defined as the ratio of the width of the resonant plate over the second thickness of the resonant plate, is greater than or equal to 5.

3. The bulk wave piezoelectric resonator according to claim 1, wherein a longitudinal form factor, defined as the ratio of the length of the resonant plate over the thickness of the resonant plate, is greater than or equal to 5.

4. The bulk wave piezoelectric resonator according to claim 1, wherein the resonant plate and the block of substrate are made in a same piezoelectric material and formed as a part in one piece.

5. The piezoelectric resonator according to claim 1, wherein the resonant plate and the block of substrate consist in a same piezoelectric material, and a crystallographic cut of the resonant plate along a plane parallel to both of its faces is selected so that an electro-acoustic coupling coefficient of a transducer formed by the resonant plate is greater than 0.0001 for bulk waves propagating in the direction of the thickness of the resonant plate.

6. The piezoelectric resonator according to claim 1, wherein the resonant plate has a constriction area in the direction of the thickness of the resonant plate over the whole of the length of resonant plate, for which the thickness of the resonant plate passes through a minimum, the resonant plate being attached to the block of substrate, the constriction area being located in a vicinity of the plane face of the block of substrate.

7. The piezoelectric resonator according to claim 1, wherein
the first material is comprised in a set of materials formed with lithium niobate, lithium tantalate, potassium niobate, piezoelectric ceramics, quartz, lithium tetraborate, gallium orthophosphate, langasite, langatate, langanite, zinc oxide and aluminum nitride, and
the second material is comprised in a set of materials formed with lithium niobate, lithium tantalate, potassium niobate, piezoelectric ceramics, quartz, lithium tetraborate, gallium orthophosphate, langasite, langatate, langanite, diamond carbon, silicon, sapphire.

8. The piezoelectric resonator according to claim 1, wherein the metal electrodes are made with a material comprised in a set of materials formed with aluminum, copper, titanium, platinum, iridium, zirconium, rubidium, molybdenum, nickel, tungsten, gold, poly-silicon, and alloys of these various metals, and the thickness of the metal electrodes being distributed to obtain a mass distribution localized at a boundary of the resonant plate and the block of substrate, to trap and concentrate bulk waves inside a local area of the resonant plate.

* * * * *